United States Patent
Yu et al.

(10) Patent No.: US 9,058,872 B2
(45) Date of Patent: Jun. 16, 2015

(54) RESISTANCE-BASED RANDOM ACCESS MEMORY

(71) Applicants: Hung-Chang Yu, Hsinchu (TW); Kai-Chun Lin, Hsinchu (TW); Yue-Der Chih, Hsinchu (TW)

(72) Inventors: Hung-Chang Yu, Hsinchu (TW); Kai-Chun Lin, Hsinchu (TW); Yue-Der Chih, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 25 days.

(21) Appl. No.: 13/755,445

(22) Filed: Jan. 31, 2013

(65) Prior Publication Data

US 2014/0211537 A1 Jul. 31, 2014

(51) Int. Cl.
G11C 11/00 (2006.01)
G11C 13/00 (2006.01)
G11C 11/412 (2006.01)
G11C 14/00 (2006.01)

(52) U.S. Cl.
CPC .......... *G11C 13/0004* (2013.01); *G11C 13/004* (2013.01); *G11C 13/0069* (2013.01); *G11C 2213/79* (2013.01); *G11C 11/412* (2013.01); *G11C 14/009* (2013.01)

(58) Field of Classification Search
CPC .............. G11C 13/0004; G11C 13/004; G11C 13/0011; G11C 2013/0042; G11C 2013/009
USPC .......... 365/148, 171, 185.03, 185.25, 189.16, 365/243.5
See application file for complete search history.

(56) References Cited

U.S. PATENT DOCUMENTS

2009/0108247 A1* 4/2009 Takaura et al. .................. 257/2

FOREIGN PATENT DOCUMENTS

JP 2007-287193 11/2007

OTHER PUBLICATIONS

Office Action dated Nov. 18, 2014 and English translation from corresponding No. JP 2013-257897.

* cited by examiner

*Primary Examiner* — Thong Q Le
(74) *Attorney, Agent, or Firm* — Lowe Hauptman & Ham, LLP

(57) ABSTRACT

A resistance-based random access memory circuit includes a first data line, a second data line, a plurality of memory cells, a first driving unit, and a second driving unit. The memory cells are arranged one following another in parallel with the first and second data lines. Each of the memory cells are coupled between the first data line and the second data line. The first driving unit is coupled with first ends of the first and second data lines. The first driving unit is configured to electrically couple one of the first data line and the second data line to a first voltage node. The second driving unit is coupled with second ends of the first and second data lines. The second driving unit is configured to electrically couple the other one of the first data line and the second data line to a second voltage node.

20 Claims, 4 Drawing Sheets

RESISTANCE-BASED RANDOM ACCESS MEMORY

BACKGROUND

In integrated circuit (IC) devices, resistance-based random access memory, such as resistive random access memory (RRAM, ReRAM), magnetoresistive random access memory (MRAM), and phase-changed random access memory (PCRAM), are being developed for next generation memory devices. Compared with charge-based random access memory, such as flash memory, a resistance-based random access memory circuit includes an array of memory cells each of which is capable of having at least a high resistance state and a low resistance state. Setting a resistance state of a memory cell of a resistance-based random access memory circuit (i.e., performing a write operation to the memory cell) is usually accomplished by applying a predetermined voltage difference or a predetermined current to the memory cell. When reading a datum from a memory cell, a predetermined reading current (or voltage) is applied to the memory cell, and the output datum is determined according to the resulting voltage (or current) of the memory cell.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
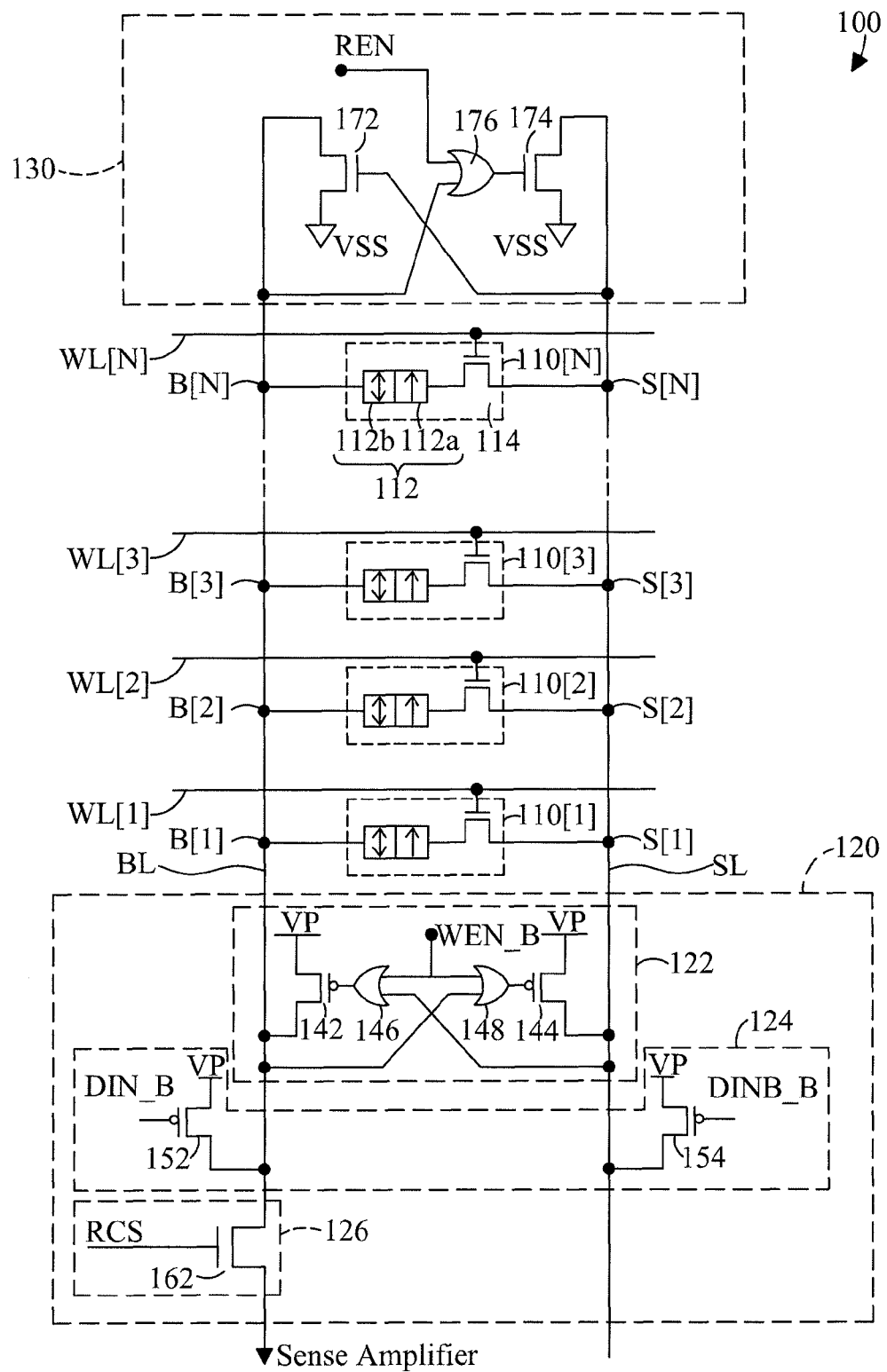
FIG. 1 is a circuit diagram of a memory column module of a resistance-based random access memory circuit in accordance with some embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a circuit diagram of a memory column module 100 of a resistance-based random access memory circuit (e.g., 300 in FIG. 3) in accordance with some embodiments. The memory column module 100 includes a first data line (also referred to as "bit line," BL), a second data line (also referred to as "source line," SL), a plurality of resistance-based memory cells 110[1], 110[2], 110[3], and 110 [N], a first driving unit 120, and a second driving unit 130. Although only four memory cells are depicted in FIG. 1, a person having ordinary skill in the art would appreciate that, in some embodiments, the memory column module 100 includes 2 or more memory cells arranged in a column. In some embodiments, N is an integer number and 2≤N. In some embodiments, N ranges from 512 to 2048.

The data line BL has a first end coupled to the first driving unit 120 and a second end coupled to the second driving unit 130. N nodes B[1], B[2], B[3], and B[N] are defined along the data line BL. The data line SL also has a first end coupled to the first driving unit 120 and a second end coupled to the second driving unit 130. N nodes S[1], S[2], S[3], and S[N] corresponding to nodes B[1], B[2], B[3], and B[N] are defined along the data line SL. The resistance-based memory cells 110[1], 110[2], 110[3], and 110 [N] are arranged one following another along a direction in parallel with the first data line BL and the second data line SL. Each of the memory cells 110[1], 110[2], 110[3], and 110 [N] have a first end connected to one of the nodes B[1], B[2], B[3], and B[N] of the data line BL and a second end connected to one of the nodes S[1], S[2], S[3], and S[N] of the data line SL corresponding to the nodes B[1], B[2], B[3], and B [N].

The memory cells 110[1], 110[2], 110[3], and 110 [N] are magnetoresistive random access memory cells selectable by a corresponding word line WL[1], WL[2], WL[3], and WL[N]. For example, an example memory cell 110 [N] includes a magnetic tunnel junction (MTJ) 112, which has a pinned layer 112a and a free layer 112b separated by a dielectric layer (not shown). The memory cell 110 [N] also has a switch 114 coupled to the word line WL[N]. When the word line WL[N] is driven to select the memory cell 110[N], the switch 114 couples the MTJ 112 with the data line SL, and thus forming a conductive path between the data line BL and the data line SL. A relative orientation of the pinned layer 112a and the free layer 112b determines a resistance of the MTJ 112. In some embodiments, the MTJ 112 has a low resistance state if the pinned layer 112a and the free layer 112b are oriented in a same direction. In some embodiments, the MTJ 112 has a high resistance state if the pinned layer 112a and the free layer 112b are oriented in opposite directions.

The first driving unit 120 is configured to electrically couple one of the data line BL and the data line SL to a voltage node VP in response to a write datum during a write operation or to a sense amplifier (e.g., 328 in FIG. 3) during a read operation. The second driving unit 130 is configured to electrically couple the other one of the data line BL and the data line SL to a voltage node VSS. In some embodiments, the voltage node VP has a voltage level higher than that of the voltage node VSS. In some embodiments, the voltage node VP and the voltage node VSS together provide a voltage difference between the first driving unit 120 and the second driving unit 130 that is sufficient to create a current to change the orientation of the free layer 112b of the MTJ 112 of the selected one of the memory cells 110[1], 110[2], 110[3], and 110[N]. In some embodiments, the voltage node VSS is coupled to ground, and the voltage node VP is coupled to a power supply having a voltage level ranging from 0.8 to 1.5 volts. Because the driving units 120 and 130 are positioned at the opposite ends of the data lines BL and SL, conductive paths created when accessing individual memory cells 110[1], 110[2], 110[3], and 110[N] travel through about the same number of segments (defined by the nodes B[1], B[2], B[3], B[N], S[1], S[2], S[3], and S[N]) of the data lines BL and SL. Therefore, the memory cells 110[1], 110[2], 110[3], and 110 [N], when being accessed, are similarly affected by the parasitic resistance of the data lines BL and SL.

The first driving unit 120 includes a write buffer 122, a write selection circuit 124, and a read selection circuit 126. The write buffer 122 includes transistors 142 and 144 and OR gates 146 and 148. Sources of the transistors 142 and 144 are coupled to the voltage node VP. Drain of the transistor 142 is coupled to the data line BL, and drain of the transistor 144 is coupled to the data line SL. The OR gate 146 has a first input coupled to the data line SL and a second input coupled to a write enable node WEN_B configured to carry a write enable signal. The OR gate 148 has a first input coupled to the data line BL and a second input coupled to the write enable node WEN_B. The OR gates 146 and 148 together function as a switching circuit for setting the transistors 142 and 144 as a pair of cross-coupled transistors when the write enable signal at the write enable node WEN_B has a logic low level. In some embodiments, transistors 142 and 144 are p-type transistors.

The write selection circuit 124 includes a transistor 152 coupled between the voltage node VP and the data line BL and a transistor 154 coupled between the voltage node VP and the data line SL. The transistor 152 is configured to pull the voltage level at the data line BL toward the voltage level of the voltage node VP in response to a control signal DIN_B. The transistor 154 is configured to pull the voltage level at the data line SL toward the voltage level of the voltage node VP in response to a control signal DINB_B, which is a signal logically complementary to the control signal DIN_B. In some embodiments, the signals DIN_B and DINB_B are generated by a row decoder (e.g., 334 in FIG. 3) based on a write datum and a set of row address signals (e.g., AY in FIG. 3) of the to-be-accessed memory cell. Moreover, the read selection circuit 126 includes a transistor 162 for electrically coupling the data line BL to a sense amplifier (e.g., 328 in FIG. 3) in response to a read column selection signal RCS. In some embodiments, transistors 152 and 154 are p-type transistors.

The second driving unit 130 includes two transistors 172 and 174 and an OR gate 176. Transistor 172 has a drain coupled to the data line BL, a source coupled to a voltage node VSS, and a gate coupled to the data line SL. Transistor 174 has a drain coupled to the data line SL, a source coupled to a voltage node VSS, and a gate coupled to an output of the OR gate 176. An input of the OR gate 176 is coupled to the data line BL, and another input of the OR gate is coupled to a read enable node REN. The OR gate 176 functions as a switching circuit for setting the transistors 172 and 174 as a pair of cross-coupled transistors when a read enable signal at the read enable node REN has a logic low level. In some embodiments, transistors 172 and 174 are n-type transistors.

In some embodiments, when setting a memory cell, such as a memory cell 110[X] (FIGS. 2A-2B) to have a low resistance state, the signal DIN_B has a logic low level and the signal DINB_B has a logic high level, and the read column selection signal RCS has a logic low level. The write enable node WEN_B has a logic low level, and thus the transistors 142 and 144 are set to function as a pair of cross-coupled transistors. X is an integer and 1≤x≤N. The read enable node has a low logic level, and thus the transistors 172 and 174 are also set to function as a pair of cross-coupled transistors. The transistor 152 is turned on to couple the data line BL with the voltage node VP, and the transistor 154 is turned off to decouple the data line SL from the voltage node VP. A conductive path is established from voltage node VP, transistors 142 and 152, nodes B[1] ... B[X] (FIGS. 2A-2B), the memory cell 110[X], nodes S[X] (FIGS. 2A-2B) ... S[N], transistor 174, to voltage node VSS.

In some embodiments, when setting a memory cell, such as the memory cell 110[X] to have a low resistance state, the signal DIN_B has a logic high level and the signal DINB_B has a logic low level, and the read column selection signal RCS has a logic low level. The write enable node WEN_B has a logic low level, and thus the transistors 142 and 144 are set to function as a pair of cross-coupled transistors. The read enable node has a low logic level, and thus the transistors 172 and 174 are also set to function as a pair of cross-coupled transistors. The transistor 152 is turned off to decouple the data line BL from the voltage node VP, and the transistor 154 is turned on to couple the data line SL to the voltage node VP. A conductive path is established from voltage node VP, transistors 144 and 154, nodes S[1] ... S[X], memory cell 110[X], nodes B[X] ... B[N], transistor 172, and the voltage node VSS.

In some embodiments, when reading a resistance state of a memory cell, such as the memory cell 110[X], the signal DIN_B and the signal DINB_B have a logic low level. The read column selection signal RCS has a logic high level, and thus the transistor 162 is turned on to couple the data line BL with the sense amplifier (e.g., 328 in FIG. 3). The write enable node WEN_B has a logic high level to turn off transistors 142 and 144. The read enable node has a low high level to turn on transistor 174 and turn off transistor 172. A conductive path is established from the sense amplifier 328, transistor 162, nodes B[1] ... B[X], the memory cell 110[X], nodes S[X] ... S[N], transistor 174, to voltage node VSS.

In FIG. 1, MRAM cells are depicted as an example embodiment of resistance-based random access memory cells. In some embodiments, the memory cells 110[1] ... 110[N] are RRAM cells or PCRAM cells.

Figure 2A:
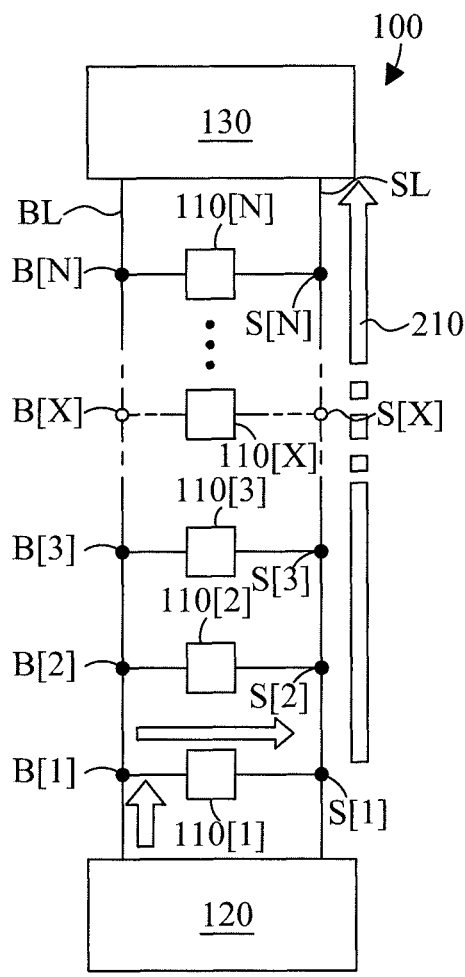
FIGS. 2A and 2B are functional block diagram of the memory column module depicted in FIG. 1 when different memory cells are accessed in accordance with some embodiments.
Figure 2B:
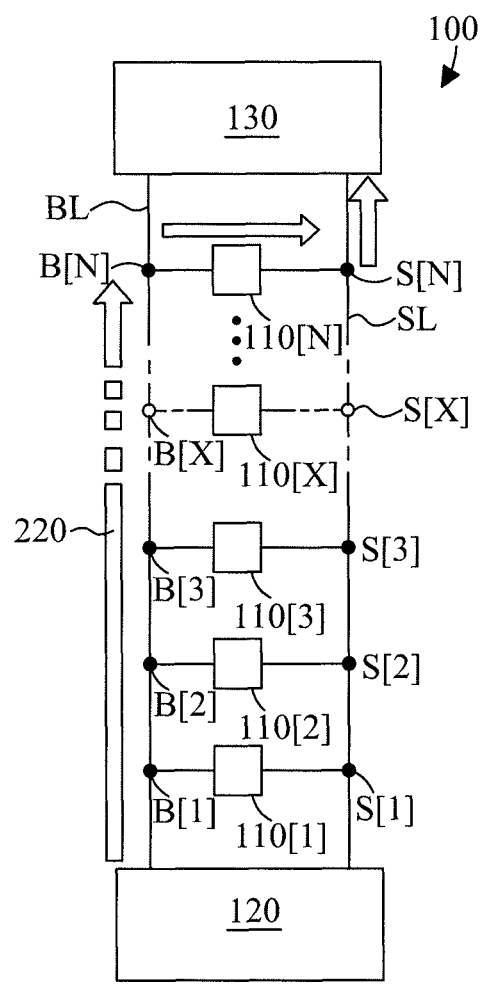

FIG. 2A is a functional block diagram of the memory column module 100 depicted in FIG. 1 when a first memory cell (i.e., memory cell 110[1]) is accessed in accordance with some embodiments. A conductive path 210 established for reading or writing memory cell 110[1] passes through node B[1], the memory cell 110[1], and nodes S[1] ... S[N]. FIG. 2B is a functional block diagram of the memory column module 100 depicted in FIG. 1 when an N-th memory cell (i.e., memory cell 110[N]) is accessed in accordance with some embodiments. A conductive path 220 established for reading or writing memory cell 110[1] passes through nodes B[1] ... B[N], the memory cell 110[1], and node S[N].

In some embodiments, the data line BL and the data line SL have similar layout and are made of similar material. Thus, the data line BL and the data line SL have similar parasitic resistance per unit-length. In some embodiments, each segment of the data line BL defined by two adjacent ones of the nodes B[1] ... B[X] has a parasitic resistance value comparable or about the same as that of a corresponding segment of the data line SL defined by nodes S[1] ... S[X]. Comparing the conductive paths 210 and 220, or any conductive path when any one of the memory cells 110[1] ... 110[N] is selected, each conductive path for accessing a memory cell has to pass through about the length of the data line BL or the length of the data line SL. Accordingly, each conductive path (such as 210 or 220) is similarly affected by the parasitic resistance of the data lines BL and SL.

Therefore, the inclusion of both driving units 120 and 130 helps to ensure that, for each selected memory cell in the memory column module, the voltage drop contributed by the parasitic resistance of the data lines BL and SL are about the same. Therefore, driving conditions for accessing memory cells at various positions in the memory column module are about the same. In contrast, in a configuration that has a driving unit only at one end of the data lines BL and SL, a voltage drop contributed by the parasitic resistance of the data lines BL and SL for a memory cell closer to the driving unit is less than that of a memory cell farther from the driving unit. In the configuration that has a driving unit only at one end of the data lines BL and SL, a driving voltage sufficient to access the closer memory cell is not sufficient for the farther memory cell, and a driving voltage sufficient to access the farther memory cell is excessive for the closer memory cell. As a result, compared with the embodiment depicted in FIGS. 1 and 2A-2B, the farther memory cells are inclined to have unsuccessful read or write operations, and the closer memory cells are inclined to be permanently damaged (i.e., no longer switchable between different resistance states) faster than the farther memory cells as stressed by excessive voltage and current. In some embodiments, the example memory column module 100 is capable of withstanding at least twice read-write cycles before any memory cell is damaged than the configuration with a driving unit at only one end of the data lines. In some embodiments, the example memory column module 100 is capable of withstanding at least 100,000 read-write cycles before any memory cell is damaged.

Figure 3:
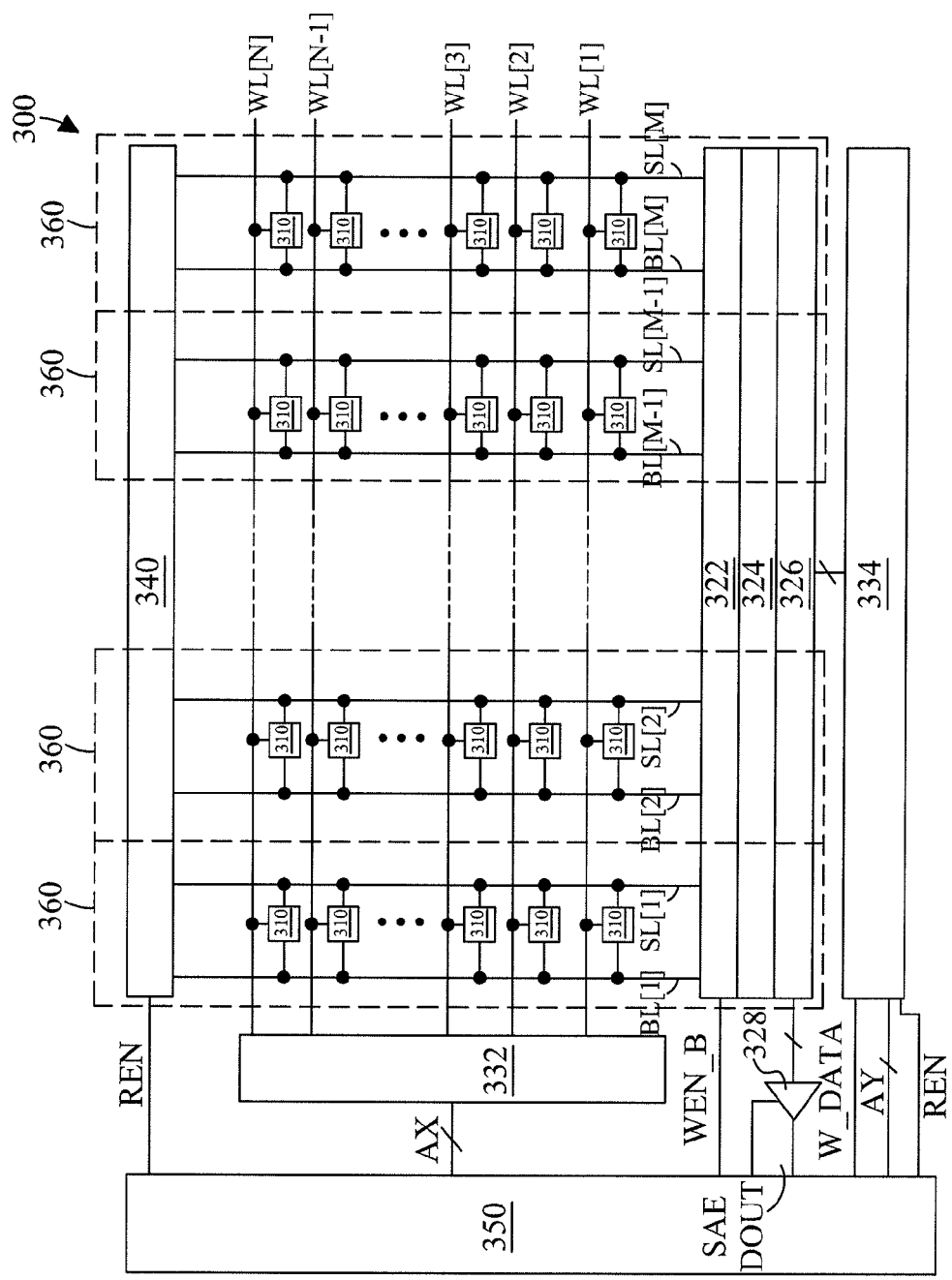
FIG. 3 is a functional block diagram of a resistance-based random access memory circuit in accordance with some embodiments.

FIG. 3 is a functional block diagram of a resistance-based random access memory circuit 300 in accordance with some embodiments. Memory circuit 300 includes an array of resistance-based memory cells 310 arranged into M rows and N columns, a write driver 322, a write multiplexer 324, a read multiplexer 326, a sense amplifier 328, a row decoder 332, a column decoder 334, an end driver 340, and a memory controller 350. Each column of memory cells 310 are coupled to corresponding data lines BL[1] . . . BL[M] and SL[1] . . . SL[M]. Each row of memory cells 310 are coupled to corresponding word lines WL[1] . . . WL[N]. M and N are positive integers. The array of memory cells, the write driver 322, the write multiplexer 324, the read multiplexer 326, and corresponding data lines BL[1] . . . BL[M] and SL[1] . . . SL[M] are also arranged to have a plurality of memory column modules 360, such as a plurality of example memory column modules 100 depicted in FIG. 1. As such, in some embodiments, all the write buffers 122 of the memory column modules 360 are collectively identified as the write driver 322; all the write selection circuits 124 of the memory column modules 360 are collectively identified as the write multiplexer 324; all the read selection circuits 126 of the memory column modules 360 are collectively identified as the read multiplexer 324; and all the driving units 130 are collectively identified as the end driver 340.

The memory controller 350 receives various signals from external circuitry related to memory circuit 300. The memory controller 350 transmits a read enable signal REN to the end driver 340 and a write enable signal WEN_B to the write driver 322. The memory controller 350 transmits row address signals AX representing a portion of the address of a to-be-accessed memory cell to the row decoder 332. The row decoder 332 generates and outputs word line signals on the word lines WL[1] . . . WL[N] in response to the row address signals AX. The memory controller 350 transmits column address signals AY representing another portion of the address of the to-be-accessed memory cell, a to-be-written datum W_DATA, and a read enable signal REN to the column decoder 334. The column decoder 334 generates corresponding control signals such as corresponding control signals DIN_B and DINB_B in response to the column address signals AY and the datum W_DATA, and generates the corresponding read column selection signal RCS in response to the column address signals AY and the read enable signal REN.

The column decoder 334 generates corresponding control signals to select two or more of the data lines BL[1] . . . BL[M] to the sense amplifier 328. In some embodiments, a datum is stored in a differential manner, and thus data lines BL of two corresponding memory column modules 360 are coupled to the sense amplifier 328 during a read operation. In some embodiments, a datum is stored in a non-differential manner, and thus the data lines BL of a selected memory column module 360, a first reference column having all high resistance state memory cells, and a second reference column having all low resistance state memory cells are coupled to the sense amplifier 328 during a read operation. The sense amplifier 328 receives the data lines BL from the read multiplexer 326 and outputs a read data DOUT to the memory controller 350.

The memory circuit 300 is an example of how a plurality of memory column modules 100 depicted in FIG. 1 are arranged to form a memory circuit. A person having ordinary skill in the art would appreciate that the memory column module 100 is usable to implement a memory circuit in conjunction with many other possible memory circuit structures.

Figure 4:
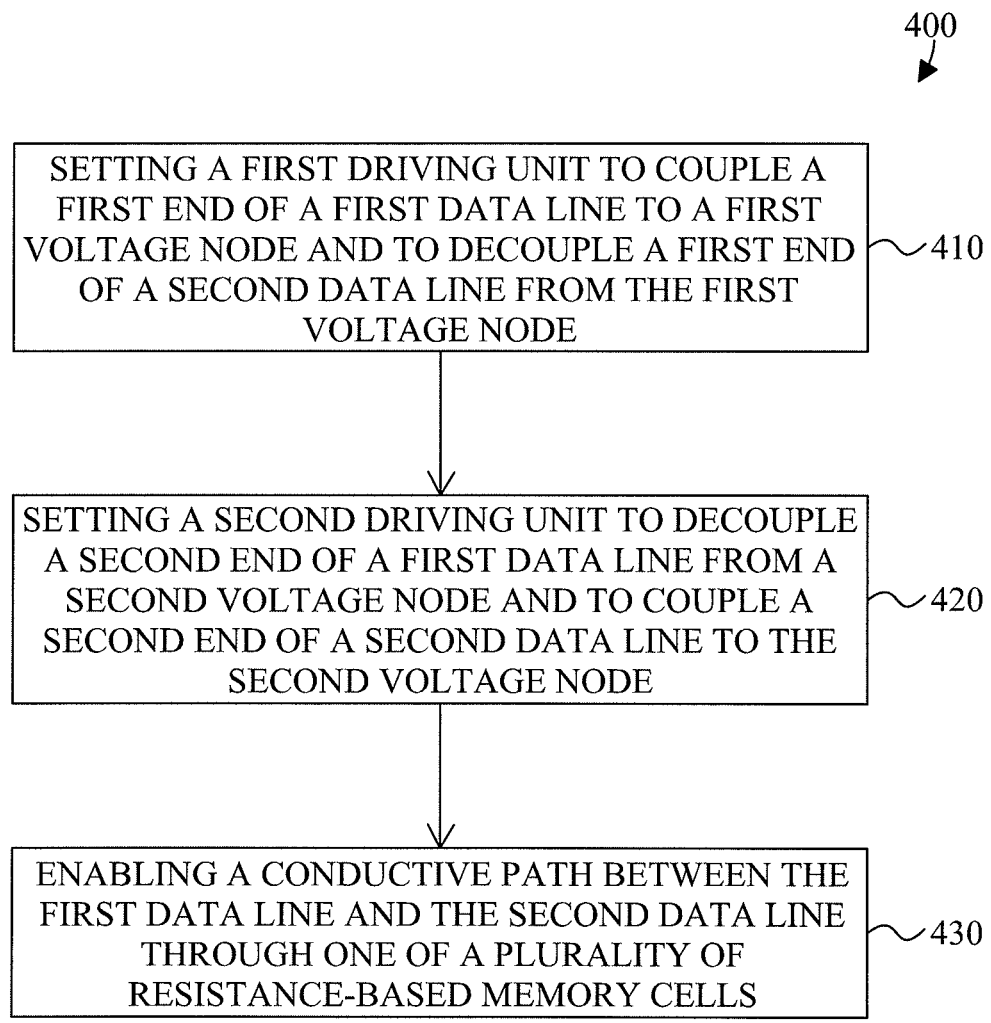
FIG. 4 is a flow chart of a method of operating a resistance-based random access memory circuit in accordance with one or more embodiments.

FIG. 4 is a flow chart of a method of operating a resistance-based random access memory circuit in accordance with one or more embodiments. It is understood that additional operations may be performed before, during, and/or after the method 400 depicted in FIG. 4, and that some other processes may only be briefly described herein.

As depicted in FIG. 4 and FIG. 1, in operation 410, a first driving unit 120 is set to couple a first end of a first data line BL to a voltage node VP and to decouple a first end of a second data line SL from the voltage node VP. In some embodiments, operation 410 includes turning on a transistor 152 of the first driving unit 120 to couple the first end of the data line BL to the voltage node VP in response to a write enable signal DIN_B generated based a write datum. In some embodiments, operation 410 also includes turning off another transistor 154 of the first driving unit 120 to decouple the first end of the data line SL from the voltage node VP in response to a write enable signal DINB_B having a logic level complementary to that of the write enable signal DIN_B. In some embodiments, in operation 410, the first driving unit 120 is set to decouple the first end of data line BL from voltage node VP and to couple the first end of data line SL to voltage node VP.

The process then moves on to operation 420, where a second driving unit 130 is set to decouple a second end of data line BL from a second voltage node VSS and to couple a second end of data line SL to the voltage node VSS. In some embodiments, operation 420 includes turning off a transistor 172 of the driving unit 130 to decouple the second end of the data line BL from the voltage node VSS. In some embodiments, operation 420 also includes turning on another transistor 174 of the driving unit 130 to couple the second end of the data line SL to the voltage node VSS. In some embodiments, in operation 420, the second driving unit 130 is set to couple the second end of data line BL to voltage node VSS and to decouple the second end of data line SL from voltage node VSS.

The process then moves on to operation 430, where a conductive path is established between the data line BL and the data line SL through one of a plurality of resistance-based memory cells 110[1] . . . 110[N] in response to a corresponding word line signal on one of the word lines WL[1] . . . WL[N].

In accordance with one embodiment, a resistance-based random access memory circuit includes a first data line, a second data line, a plurality of resistance-based memory cells, a first driving unit, and a second driving unit. The plurality of resistance-based memory cells are arranged one following another along a direction in parallel with the first data line and the second data line. Each of the plurality of resistance-based memory cells have a first end coupled with the first data line and a second end coupled with the second data line. The first driving unit is coupled with a first end of the first data line and a first end of the second data line. The first driving unit is configured to electrically couple one of the first data line and the second data line to a first voltage node. The second driving unit is coupled with a second end of the first data line and a second end of the second data line. The second driving unit is configured to electrically couple the other one of the first data line and the second data line to a second voltage node.

In accordance with another embodiment, a resistance-based random access memory circuit includes a plurality of memory column modules. Each of the plurality of memory column modules includes a first data line, a second data line, N resistance-based memory cells, a first driving unit, and a second driving unit. N is an integer and 2≤N. The first data line has N nodes defined between a first end of the first data line and a second end of the first data line. The second data line has N nodes defined between a first end of the second data line and a second end of the second data line. Each of the N resistance-based memory cells has a first end connected to one of the N nodes of the first data line, and a second end connected to one of the N nodes of the second data line corresponding to the one of the N nodes of the first data line. The first driving unit is coupled with the first end of the first data line and the first end of the second data line. The second driving unit is coupled with the second end of the first data line and the second end of the second data line. The first driving unit and the second driving unit are configured to create a conductive path passing through first X, counting from the first end of the first data line, of the N nodes of the first data line and (N−X+1), counting from the second end of the second data line, of the N nodes of the second data line. X is an integer and 1≤x≤N.

In accordance with another embodiment, a method of operating a resistance-based random access memory circuit includes setting a first driving unit to couple a first end of a first data line to a first voltage node and to decouple a first end of a second data line from the first voltage node. A second driving unit is set to decouple a second end of the first data line from a second voltage node and to couple a second end of the second data line to the second voltage node. A conductive path is established between the first data line and the second data line through one of a plurality of resistance-based memory cells of the memory circuit in response to a word line signal. The plurality of resistance-based memory cells are arranged in a column along the first data line and the second data line, and each of the plurality of resistance-based memory cells have a first end coupled with the first data line and a second end coupled with the second data line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistance-based random access memory circuit, comprising:
    a first data line having a first end and a second end;
    a second data line having a first end and a second end;
    a plurality of resistance-based memory cells arranged one following another along a direction in parallel with the first data line and the second data line, each of the plurality of resistance-based memory cells having a first end coupled with the first data line and a second end coupled with the second data line;
    a first driving unit coupled with a first voltage node, the first end of the first data line, and the first end of the second data line; and
    a second driving unit coupled with a second voltage node, the second end of the first data line, and the second end of the second data line,
    wherein the first driving unit and the second driving unit are configured to electrically couple one data line of the first data line and the second data line to the first voltage node and to electrically couple the other data line of the first data line and the second data line to the second voltage node during a time period.

2. The memory circuit of claim 1, wherein the first driving unit comprises:
    a first transistor;
    a second transistor; and
    a switching circuit configured to set the first transistor and the second transistor as a pair of cross-coupled transistors in response to a logic level of a write enable signal.

3. The memory circuit of claim 2, wherein the switching circuit comprises:
    a control path configured to carry the write enable signal;
    a first OR gate comprising:
        an output node coupled to a gate of the first transistor;
        a first input node coupled to the control path; and
        a second input node coupled to a drain of the second transistor; and
    a second OR gate comprising:
        an output node coupled to a gate of the second transistor;
        a first input node coupled to the control path; and
        a second input node coupled to a drain of the first transistor.

4. The memory circuit of claim 2, wherein the first and second transistors are p-type transistors.

5. The memory circuit of claim 2, wherein the first driving unit further comprises:
    a transistor configured to couple the first data line to the first voltage node in response to a write datum.

6. The memory circuit of claim 2, wherein the first driving unit further comprises:
    a transistor configured to couple the second data line to the first voltage node in response to a write datum.

7. The memory circuit of claim 1, wherein the second driving unit comprises:
    a first transistor;
    a second transistor; and
    a switching circuit configured to set the first transistor and the second transistor as a pair of cross-coupled transistors in response to a logic level of a read enable signal.

8. The memory circuit of claim 7, wherein the switching circuit comprises:
    a control path configured to carry the read enable signal; and
    an OR gate comprising:

an output node coupled to a gate of the first transistor;
a first input node coupled to the control path; and
a second input node coupled to a drain of the second transistor.

9. The memory circuit of claim 7, wherein the first and second transistors are n-type transistors.

10. The memory circuit of claim 1, wherein the first voltage node is configured to carry a first voltage level, and the second voltage node is configured to carry a second voltage level lower than the first voltage level.

11. The memory circuit of claim 1, wherein the resistance-based memory cells are resistive random access memory cells, magnetoresistive random access memory cells, or phase-changed random access memory cells.

12. A resistance-based random access memory circuit comprising a plurality of memory column modules, each of the plurality of memory column modules comprising:
a first data line comprising a first end, a second end, and N nodes defined between the first end of the first data line and the second end of the first data line, and N being an integer and 2≤N;
a second data line comprising a first end, a second end, and N nodes defined between the first end of the second data line and the second end of the second data line;
N resistance-based memory cells, each of the N resistance-based memory cells having a first end connected to one of the N nodes of the first data line, and a second end connected to one of the N nodes of the second data line corresponding to the one of the N nodes of the first data line;
a first driving unit coupled with the first end of the first data line and the first end of the second data line; and
a second driving unit coupled with the second end of the first data line and the second end of the second data line,
wherein the first driving unit and the second driving unit are configured to create a conductive path passing through first X, counting from the first end of the first data line, of the N nodes of the first data line and (N−X+1), counting from the second end of the second data line, of the N nodes of the second data line, X being an integer and 1≤X≤N.

13. The memory circuit of claim 12, wherein
the first driving unit is configured to electrically couple one of the first data line and the second data line to a first voltage node in response to a write datum; and
the second driving unit is configured to electrically couple the other one of the first data line and the second data line to a second voltage node.

14. The memory circuit of claim 13, wherein the first driving unit comprises:
a first transistor;
a second transistor; and
a switching circuit configured to set the first transistor and the second transistor as a pair of cross-coupled transistors in response to a logic level of a write enable signal.

15. The memory circuit of claim 13, wherein the second driving unit comprises:
a first transistor;
a second transistor; and
a switching circuit configured to set the first transistor and the second transistor as a pair of cross-coupled transistors in response to a logic level of a read enable signal.

16. The memory circuit of claim 13, wherein the first voltage node is configured to carry a first supply voltage, and the second voltage node is configured to carry a second supply voltage lower than the first supply voltage.

17. The memory circuit of claim 12, wherein the resistance-based memory cells are resistive random access memory cells, magnetoresistive random access memory cells, or phase-changed random access memory cells.

18. A method of operating a resistance-based random access memory circuit, the method comprising:
setting a first driving unit to couple a first end of a first data line to a first voltage node and to decouple a first end of a second data line from the first voltage node;
setting a second driving unit to decouple a second end of the first data line from a second voltage node and to couple a second end of the second data line to the second voltage node; and
establishing a conductive path between the first data line and the second data line through one of a plurality of resistance-based memory cells of the memory circuit in response to a word line signal, the plurality of resistance-based memory cells being arranged in a column along the first data line and the second data line, each of the plurality of resistance-based memory cells having a first end coupled with the first data line and a second end coupled with the second data line.

19. The method of claim 18, wherein the setting the first driving unit comprises:
turning on a first transistor of the first driving unit to couple the first end of the first data line to the first voltage node in response to a first control signal; and
turning off a second transistor of the first driving unit to decouple the first end of the second data line from the first voltage node in response to a second control signal having a logic level complementary to that of the first control signal.

20. The method of claim 18, wherein the setting the second driving unit comprises:
turning off a first transistor of the second driving unit to decouple the second end of the first data line from the second voltage node in response to a logic level of the second data line; and
turning on a second transistor of the second driving unit to couple the second end of the second data line to the second voltage node in response to a logic level of the first data line.

* * * * *